United States Patent [19]

Wilson

[11] 3,778,681

[45] Dec. 11, 1973

[54] MODULAR PRINTED CIRCUIT BOARD ASSEMBLY

[75] Inventor: Randy Eugene Wilson, Springfield, Mo.

[73] Assignee: Litton Systems, Inc., Springfield, Mo.

[22] Filed: Aug. 23, 1972

[21] Appl. No.: 283,196

[52] U.S. Cl. ........................ 317/101 DH, 339/17 LC
[51] Int. Cl. ............................................. H05k 1/04
[58] Field of Search.............. 317/101 DH, 101 CC, 317/101 C; 339/17 LC, 17 M, 17 LM; 325/355

[56] References Cited

UNITED STATES PATENTS

| | | | |
|---|---|---|---|
| 2,945,989 | 7/1960 | Vogel et al. | 339/17 LM |
| 2,752,580 | 6/1956 | Shewmaker | 317/101 CC |

FOREIGN PATENTS OR APPLICATIONS

| | | | |
|---|---|---|---|
| 454,998 | 6/1968 | Switzerland | 317/101 DH |
| 1,195,829 | 7/1965 | Germany | 317/101 DH |
| 1,230,475 | 12/1966 | Germany | 317/101 DH |

OTHER PUBLICATIONS

"Plug in Components", Electronics, July 1949 p. 196 (copy 325–355)

*Primary Examiner*—David Smith, Jr.
*Attorney*—Ronald M. Goldman

[57] ABSTRACT

A printed circuit card holder assembly includes a U-shaped metal member having elongated rails for supporting the cards between the rails. The rails include a plurality of upwardly projecting metal prongs. The rails are of an L-shaped cross section such as is found in common aluminum channel members. A plurality of printed circuit boards containing electrical circuit paths are mounted side by side along the rails with each board bridging the two rails. Each circuit board card includes a plurality of metal walled passages at each of its opposed ends, which plurality corresponds in number with the adjacent metal prongs, and the cards are individually held in place atop the rails by means of a friction fit between the prongs and the passages in the printed circuit board. One or more passages in each board may be placed electrically in common with one or more of the electrical circuit paths printed on the circuit card. In this way those electrical circuit paths on the board are placed electrically in common with the metal rails. And each circuit board may be individually inserted or removed from the supporting metal member without disturbing the remaining circuit boards.

3 Claims, 2 Drawing Figures

PATENTED DEC 11 1973

3,778,681

MODULAR PRINTED CIRCUIT BOARD ASSEMBLY

FIELD OF THE INVENTION

This invention relates to a modular printed circuit board assembly and, more particularly, to a rack or carrier member and printed circuit board combination in which a plurality of circuit boards may be conveniently carried as a unit and independently removed or installed on said unit.

BACKGROUND OF THE INVENTION

As is well-known, modular assemblies are available in which printed circuit boards are individually inserted into place in an assembly. Typically, such assemblies include a metal frame in the form of a three-dimensional rectangular box frame with a series of parallelly-arranged connector sockets located in the rear, and each circuit board contains a series of contacts along its edge or a special connector which engages the socket in the rack to mechanically and electrically couple the board in place in the frame so that a series of parallelly-mounted circuit boards are mounted within the boxlike metal frame. Frequently a handle is attached to the exposed end of each individual circuit board to permit more convenient insertion and withdrawal of the board from its position in the frame. In another known arrangement, a plurality of printed circuit boards are mounted on a single rack side by side in a common plane and the entire rack is inserted into a single channel in a support member. In this less frequently used arrangement, the carrier assembly includes two opposed channel members and the circuit boards are slid serially into the channel. Such constructions have several disadvantages, namely as follows: In the first arrangement mentioned above, the individual circuit card is commonly of a specific electrical characteristic or design function and cannot be used in the research and development areas without an added expensive of rework or rewiring. In the second arrangement mentioned above, the ability to exchange the electrical characteristic of an individual circuit board or to remove one circuit board from the assembly or channel without disturbing the other circuit boards in the assembly is very difficult and will on occasion increase cost so that this assembly method becomes impractical. Also in this arrangement the channel assembly is difficult to insert in the standard type card edge chassis mount, and is also difficult to insure a common electrical buss or connection through the rail or channel.

OBJECTS OF MY INVENTION

Accordingly, it is an object of my invention to provide a novel modular printed circuit board and carrier assembly.

It is a still further object of the invention to provide a circuit board assembly in which the circuit boards are arranged in a common plane and in which each circuit board may be individually inserted or withdrawn from the carrier member without disturbing the other boards.

It is an additional object of my invention to provide a modular printed circuit board assembly in which the frame of the carrier may be used as a ground or electrical common.

And it is a still further object of the invention to provide a modular printed circuit board assembly that is simple in construction and economical to manfuacture.

BRIEF SUMMARY OF THE INVENTION

In accordance with the foregoing objects, my invention includss a U-shaped metal member having elongated rails. The rails are spaced apart and parallel and form a pair of flat striplike upper surfaces that are coplanar and are joined together at one end by a metal crossmember, substantially perpendicular to both rails to define a substantially U-shaped geometry. A plurality of printed circuit boards are spaced side by side spanning the space between the metal stems with the bottommost one of said circuit boards being spaced from the bottom crossmember so as to allow the crossmember to be grasped as a handle. Metal prong means are provided on each of the rails to firmly connect the end of the board overlying the respective rail to the carrier and to place some portion of the printed circuit board electrically in common with the rail.

Further in accordance with the invention, each of the boards has a plurality of metal eyelets spaced apart on opposed ends of the board overlying the rails and each forming passages through the respective circuit board. A corresponding plurality of metal prongs are spaced apart and mounted to each of the rails to engage a corresponding eyelet to form a firm frictional and electrical connection therebetween.

The foregoing and other objects and advantages characteristic of my invention, and the specific arrangement and manner of cooperation of the elements comprising the invention, together with substitute elements and equivalent elements, are better understood from consideration of the detailed description of the preferred embodiment of my invention, which follows, considered together with the figures of the drawings.

DETAILED DESCRIPTION OF THE INVENTION

Figures 1, 2:
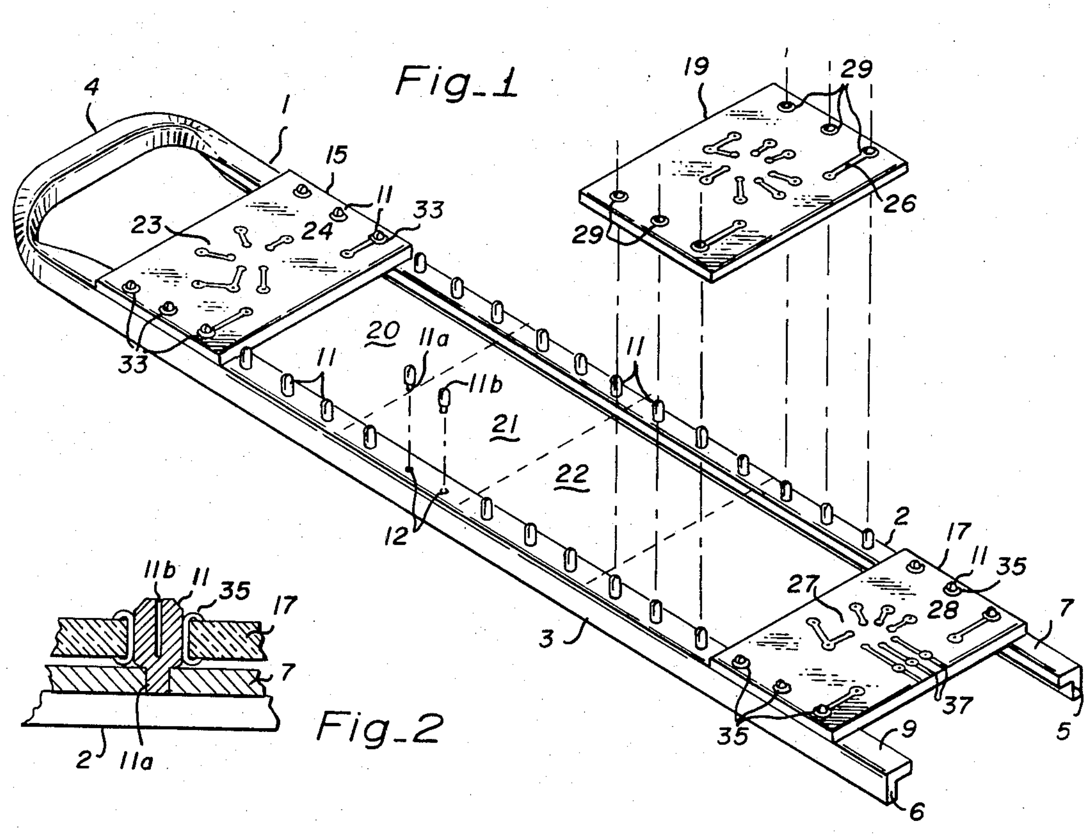
FIG. 1 illustrates in partially exploded perspective a preferred embodiment of my invention.
FIG. 2 illustrates in cross section a fastener which is used in the preferred embodiment of FIG. 1.

In FIG. 1 a generally U-shaped bracket member 1, suitably of a metal, particularly aluminum, includes two elongated rail portions, 2 and 3, which are joined together at one end by a metal crossmember 4 that is integral with the rails. Each of the rails 2 and 3 are of the same length, are spaced apart parallel, and member 4 is substantially perpendicular to each to define a U-shaped geometry. And rails 2 and 3 have flat strip surfaces, 7 and 9, that are substantially co-planar. Rail 2 includes a depending strip or rim 5 along an outer edge substantially perpendicular to upper surface 7 so as to provide an L-shaped cross section. Likewise, rail 3 includes a depending strip or rim 6 along its outer edge, perpendicular to upper surface 9 to form an L-shaped cross section. And these rims result in a more rigid rail. The U-shaped member may be formed by bending a single strip of L-shaped aluminum channel strip material in the shape of a U and thereupon twisting the crossmember 4 around, as shown by the arrow, so as to fashion a more grippable surface.

A plurality of substantially identical metal prongs 11 are spaced apart and mounted to the rails as is illustrated in FIG. 1. These form two columns of prongs;

one column on each of surfaces 7 and 9. As is apparent from the two prongs, 11*a* and 11*b*, illustrated in exploded view, this is accomplished in one manner by drilling suitable holes 12 in the rails and forcing an end of the prongs into said openings. Typically the hole diameter of holes 12 is such as to form a tight fit with the bottom portion of the prong 11 so as to require substantial force to install the prong in position on the rail. However this assures a firm mechanical and electrical connection between the respective prong and the supporting rail. Alternatively, it is apparent that the prongs may be soldered or brazed in place, or even welded in place.

A first printed circuit board 15 is installed in place bridging the space between rails 2 and 3. A like printed circuit board 17 at the front end of the member is similarly mounted bridging the space between rails 2 and 3. A third printed circuit board 19 is illustrated in exploded position, and fourth, fifth and sixth circuit boards, 20, 21, and 22, are illustrated by invisible dashed lines so as to allow a clear illustration of the underlying rails and prongs. In each the right edge of the circuit board as viewed in the illustration overlies the width of surface 7 of rail 2 and the opposed left edge of the circuit board overlies the width of surface 9 of rail 3.

Electrical circuit boards typically include some form of electrically conductive paths patterned on the surface of the boards and this is generally represented as 23, 25, 27, on boards 15, 19 and 17, respectively. Typically various electrical components, not illustrated, are mounted to and interconnected with such printed wiring.

As illustrated in the figure, circuit board 19 includes six eyelets, commonly labeled 29 for convenience, three of which are spaced apart along the right edge of the board and three are spaced along the left edge. Each of these eyelets is of a metal material and is mounted to a passage predrilled into circuit board 19. As is conventional in an eyelet type fastener, a portion of the circular metal portion is exposed on each of the top and bottom surfaces of the printed circuit board and a cylindrical metal lined passage extends therebetween.

A portion of the printed electrical conductor on the surface of circuit board 19, such as 26, is electrically connected to an eyelet 29.

In like manner, circuit board 15 includes six eyelets 33, one of which is connected to a portion of printed circuit conductor 24; circuit board 17 includes six eyelets 35, one of which is connected to a portion of printed circuit conductor 28; and each of the circuit boards 20, 21, and 22 indicated by invisible lines will have the same number of eyelets similarly located as on boards 15, 17 and 19 and, preferably, including a portion of printed conductor on each board being connected to at least one eyelet on said respective board.

As is apparent however, the number of eyelets used as well as corresponding prongs can be varied. Likewise, there is no requirement that each circuit board have the same number of eyelets as any other circuit board. And one or more than one of the eyelets need be connected to printed wiring.

Each of the printed circuit boards is pressed into place across rails 2 and 3 so that the respective eyelets engage a corresponding one of the metal prongs, such as prongs 11 engaging eyelets 33 in circuit board 15 and prongs 11 engaging eyelets 35 in circuit board 17. The relative dimension of the prong is such as to form a good friction fit with the inner walls of the eyelets. Thus the prongs securely hold the corresponding circuit board in place across the rails and concurrently place the metal of the eyelet in electrical contact with the rail 2 or 3. Accordingly, any portion of the printed electrical conductors on the surface of the printed circuit boards which is in connection with the eyelet will be placed electrically in common with the metal rail.

The cross sectional segmented view of FIG. 2 illustrates in greater detail the relationship of prongs 11 and eyelets 35. A prong 11 is installed in a passage in the surface 7 of rail 2. The prong contains a small diameter portion 11a which fits within an opening in the surface 7 and an enlarged diameter upper portion. Suitably the prong 11 is slotted as at 11*b* to a depth greater than the thickness of a printed circuit board. This allows the prong to yield and the portions to squeeze together. The eyelet 35 is fastened to the circuit board 17 and grips both the bottom and top surfaces of the printed circuit board. In addition, the body of the eyelet forms a conductively walled metal walled passage through the printed circuit board. Suitably the outer diameter of prong 11 is sufficiently large compared to the inner diameter of the eyelet so as to require some compression to be radially exerted on the prong when the circuit board 17 is in place. In this way, a firm mechanical frictional connection is assured and the printed circuit board cannot shake loose or move in position. Because both the eyelet and prong are metal, an electrical current path exists from the eyelet through prong 11 to the surface 7 of rail 2.

Referring again to FIG. 1, it is seen that the lowermost printed circuit board 15 is spaced by a sufficient distance from the crossmember 4 so as to allow member 4 to be gripped by hand. Thus, the metal member 1 and all installed printed circuit boards may be carried in one hand as a unit. In like manner, the handle forms the means of inserting the entire unit in a suitable rack. In one instance, the outermost circuit board 17, may contain a series of electrical printed contacts 37, which engage a rack mounted connector, not illustrated. By means of suitable interwiring, each of the other circuit boards may be wired in circuit together with electrical wires which underlie the rails to the outermost circuit board. Alternatively, a special connector can be coupled to circuit board 17 and mechanically mounted thereon and this connector will have contacts which engage a rack mounted connector.

Additionally, to insure a universal adaptation of the assembly structure, each of the rails has been scored at four places as at 36, 37, 38 and 39. This allows the rails to be shortened by the distance to the score by simply breaking it off an equal length on each of the rails, which would be done if it is desired to carry a fewer number of printed circuit board cards in a unitary assembly. To provide a more comfortable hand grip at member 4, the crossmember is covered with a plastic material, such as plastisol, which is allowed to harden, or wrapped with tape. This prevents the hand from direct contact with metal and thus avoids any electrical shock to the person handling the unit.

The foregoing details of the preferred embodiment of the invention have been presented in order to relate to one skilled in the art how to make and use the invention and not by way of limitation to the invention, inasmuch as other substitute elements and equivalents as well as modifications and improvements to my invention become apparent to one skilled in the art upon reading this specification. Accordingly, it is expressly understood that my invention is to be broadly construed within the spirit and scope of the appended claims.

What I claim is:

1. In combination:

a U-shaped metal bracket including:

first and second elongated rails of a predetermined length, said rails having an inverted L-shaped cross section to form flat upper support surfaces and being spaced apart parallel with the bottom stems of the L of said rails facing one another and oriented substantially co-planar with one another and with the side stems of each of said rails depending downwardly from the respective bottom L stems parallel to one another to form opposed skid surfaces, and a crossmember integral with said rails joining together one end of each of said first and second rails and substantially perpendicular to each to define with said rails a generally U-shaped geometry, said crossmember having an L-shaped cross section with its bottom stem inclined downwardly at an angle to the plane of said flat upper support surfaces of said rails and with its side stem projecting outwardly away from said rails;

a plurality of printed circuit boards having left and right side edges, each of said boards arranged bridging the space between said rals and having a respective edge overlying a respective one of said rails, each of said circuit boards containing a plurality of metal eyelets along each of said left and right side edges at a location overlying the surface of a corresponding rail, said eye-lets forming an electrically conductive walled passage through said circuit boards being electrically connected in circuit with an electrically conductive path on such circuit board;

a plurality of metal prongs coupled to said rails and extending outwardly upward from the upper surface of each said rails, each of said prongs engaging a corresponding eyelet in said circuit boards for maintaining said circuit boards in place and forming a current conducting path between said eyelets and said U-shaped bracket; and a space between said crossmember and the most adjacent one of said circuit boards of a predetermined distance to permit said crossmember to be grasped by the hand for use as a handle.

2. The invention as defined in claim 4 further comprising dielectric means covering the crossmember to form an electrical insulating handle.

3. The invention as defined in claim 1 wherein each of said rails has a plurality of spaced scores so as to permit said rails to be shortened.

* * * * *

PO-1050
(5/69)

UNITED STATES PATENT OFFICE

CERTIFICATE OF CORRECTION

Patent No. U.S. 3,778,681 Dated December 11, 1973

Inventor(s) Randy Eugene Wilson

It is certified that error appears in the above-identified patent and that said Letters Patent are hereby corrected as shown below:

In Column 6, line 1, the word "rals" should read -- rails --;
In Column 6, line 22, "claim 4" should read -- claim 1 --.

Signed and sealed this 21st day of May 1974.

(SEAL)
Attest:

EDWARD M.FLETCHER,JR.
Attesting Officer

C. MARSHALL DANN
Commissioner of Patents